(12) United States Patent
Chu et al.

(10) Patent No.: US 6,498,802 B1
(45) Date of Patent: Dec. 24, 2002

(54) ORGANIC MICRO-CAVITY LASER

(75) Inventors: Hye-Yong Chu, Taejon (KR); Jeong-Ik Lee, Kyoungki-do (KR); Seong-Hyun Kim, Taejon (KR); Lee-Mi Do, Taejon (KR); Heuk Park, Taejon (KR); Do-Hoon Hwang, Taejon (KR); Tae-Hyoung Zyung, Taejon (KR)

(73) Assignee: Electronics and Telecommunications Research Institute, Taejon (KR)

( * ) Notice: Subject to any disclaimer, the term of this patent is extended or adjusted under 35 U.S.C. 154(b) by 0 days.

(21) Appl. No.: 09/475,118

(22) Filed: Dec. 30, 1999

(30) Foreign Application Priority Data

Dec. 2, 1999 (KR) ........................................ 1999-54395

(51) Int. Cl.$^7$ ................................................ H01S 3/14
(52) U.S. Cl. ..................................... 372/39; 372/9.6
(58) Field of Search ..................... 372/39, 96; 257/40, 257/98

(56) References Cited

U.S. PATENT DOCUMENTS

| | | | | |
|---|---|---|---|---|
| 5,088,099 A | * | 2/1992 | Chen | 372/45 |
| 5,682,402 A | | 10/1997 | Nakayama et al. | 372/99 |
| 6,160,828 A | * | 12/2000 | Kozlov | 372/39 |
| 6,246,708 B1 | * | 6/2001 | Thornton | 372/50 |
| 6,330,262 B1 | * | 12/2001 | Burrows | 372/39 |

OTHER PUBLICATIONS

McGehee, et al.; *Semiconducting polymer distributed feedback lasers*; Mar. 30, 1998; pp. 1536–1538.
Masenelli, et al.; *Controlled spontanous emission of a tri (8–hydroxyquinoline) alumium layer in a microcavity*; Mar. 15, 1999; pp. 3032–3038.

* cited by examiner

Primary Examiner—Paul Ip
Assistant Examiner—Gioacchino Inzirillo
(74) Attorney, Agent, or Firm—Jacobson Holman PLLC

(57) ABSTRACT

An organic micro-cavity lasers which can reduce an optical loss and derive the lasing by the electrical pumping is disclosed. The laser of the present invention has a bottom mirror layer formed on a substrate, a bottom electrode formed on the bottom mirror layer, an active layer formed on the bottom electrode, a top electrode formed on a peripheral portion of the active layer and a top mirror layer formed on the active layer except the peripheral portion. Therefore, the laser of the present invention can greatly reduce the optical loss since it has the bottom mirror layer, the active layer and the top mirror layer. Also, the injection of current can sufficiently accomplished because the top electrode having a ring shape is formed at the peripheral portion of the active layer so as to inject the current to the active layer.

12 Claims, 5 Drawing Sheets

CONDUCTION   VALENCE
   BAND        BAND

CONDUCTION   VALENCE
   BAND        BAND

ORGANIC MICRO-CAVITY LASER

BACKGROUND OF THE INVENTION

1. Field of the Invention

The present invention relates to an organic micro-cavity laser, and more particularly to an organic micro-cavity laser comprising an active layer made of an organic material.

2. Prior Art of the Invention

An organic laser diode having an active layer composed of an organic material is generally superior to the conventional semiconductor laser diode because the organic laser diode does not have disadvantage such as a lattice mismatching during the epitaxial growth of the semiconductor laser diode. Also, the organic laser diode can be manufactured by a simple process. Furthermore, since the organic laser diode can accomplish the lasing of all the visible lights according to the synthetic process of the organic material as an active layer, the intensive researches for the organic laser diode have been accomplished to utilize as the next generation visible laser diode.

FIG. 1 is a cross-sectional view for showing the conventional optical pumping organic micro-cavity laser.

Referring to FIG. 1, the conventional organic micro-cavity laser comprises a bottom mirror layer 102 formed on a substrate 101, an active layer 103 formed on the bottom mirror layer 104 and a top mirror layer 104 formed on the active layer 103. In the conventional organic micro-cavity laser, those layers 102, 103, 104 are vertically piled up so as to accomplish the lasing characteristic by the optical pumping.

The heat is generated in the organic material during the operation of the laser since the electrical conductivity of the organic material is lower than that of the semiconductor. The lasing characteristic of the organic laser may fatally deteriorate by the generated heat. Thus, the configuration as shown in FIG. 1 cannot be applied to an electrical pumped laser diodes which implements the lasing by not the optical pumping but the electrical pumping. However, it has not been developed that the mirror layer composed of an organic material having good electrical conductivity which is suitable for the organic micro-cavity laser. Therefore, the electrical pumping micro-cavity laser has the configuration as shown in FIG. 2. That is, the electrical pumping micro-cavity laser comprises a bottom mirror layer 202 formed on a substrate 201, a transparent bottom electrode 203 formed on the bottom mirror laser 202, an active layer 204 made of an organic material and formed on the bottom electrode 203 and a top electrode 205 formed on the active layer 205. The conventional electrical pumping micro-cavity laser, however, cannot sufficiently reduce the optical loss because the conventional electrical pumping laser does not have a top mirror layer. Also, the conventional electrical pumping micro-cavity laser cannot have good lasing characteristic since the cavity does not have good electrical property.

SUMMARY OF THE INVENTION

Considering the above-mentioned problems, it is an object of the present invention to provide an organic micro-cavity having a top mirror layer and an active layer which can efficiently implement current injecting to the active layer so as to minimize the optical loss in a cavity.

To achieve the object of the present invention, there is provided an organic micro-cavity laser comprising a bottom mirror layer formed on a substrate, a bottom electrode formed on the bottom mirror layer, an active layer formed on the bottom electrode, a top electrode having a ring shape formed on a peripheral portion of the active layer and a top mirror layer formed on the active layer except the peripheral portion of the active layer.

Preferably, the bottom and the top mirror layers respectively have multi layer structures composed of distributed Bragg reflectors and the bottom and the top mirror layers are composed of an organic material such as SiOx/TiOx or SiOx/MgOx.

The bottom and the top mirror layers have thickness of $\lambda/4n$ wherein $\lambda$ means a wavelength and n represents a reflective index.

An uppermost layer of the bottom mirror layer and the bottom electrode have thicknesses of $\lambda/4n$, respectively, or thickness of the uppermost layer of the bottom mirror layer and the bottom electrode have a $\lambda/4n$ thickness.

The bottom electrode is composed of an indium tin oxide.

The active layer is preferably made of an organic material consisted of a single molecule or a polymer.

According to one preferred embodiment of the present invention, the active layer is a luminescent layer of single layer.

As for another preferred embodiment of the present invention, the active layer comprises a hole transport layer, a luminescent layer formed on the hole transport layer and an electron transport layer formed on the luminescent layer. As for another preferred embodiment of the present invention, the active layer can comprise a first barrier layer formed on the hole transport layer, a luminescent layer formed on the first barrier layer, and a second barrier layer formed on the luminescent layer. At that time, the active layer has a single well structure and the first and the second barrier layers are composed of materials having band gaps larger than a band gap of the luminescent layer.

According to still another embodiment of the present invention, the active layer comprises a hole transport layer, a plurality of barrier layers formed on the hole transport layer, a plurality of luminescent layers respectively formed between the barrier layers and an electron transport layer formed on an uppermost layer of the barrier layers. In this case, the active. layer has a multi well structure.

Preferably, the top electrode is composed of one metal selected from the group consisting of aluminum, calcium, lithium, magnesium and an alloy of those metals and the top electrode has a ring shape.

Therefore, the organic micro-cavity laser of the present invention can greatly reduce the optical loss in the cavity since the laser has the bottom mirror layer, the active layer and the top mirror layer. In addition, the injection of current can be sufficiently accomplished because the top electrode having the ring shape is formed at the peripheral portion of the active layer so as to inject the current to the active layer. Also the organic micro-cavity laser can be lased by the electrical pumping.

BRIEF DESCRIPTION OF THE DRAWINGS

The above object and advantages of the present invention will become more apparent by describing in detail the preferred embodiments thereof with reference to the attached drawings, in which.

DETAILED DESCRIPTION OF THE INVENTION

Hereinafter, the preferred embodiments of the present invention will be explained in more detail with reference to the accompanying drawings.

FIG. 3A to FIG. 3D are cross-sectional views for illustrating a manufacturing process for an organic micro-cavity laser according to the preferred embodiments of the present invention and FIG. 4A to FIG. 4H are diagrams fro illustrating structures of various active layers and energy bands according to the present invention.

The structure of the organic micro-cavity of the present invention will be described as follows.

Figure 1:
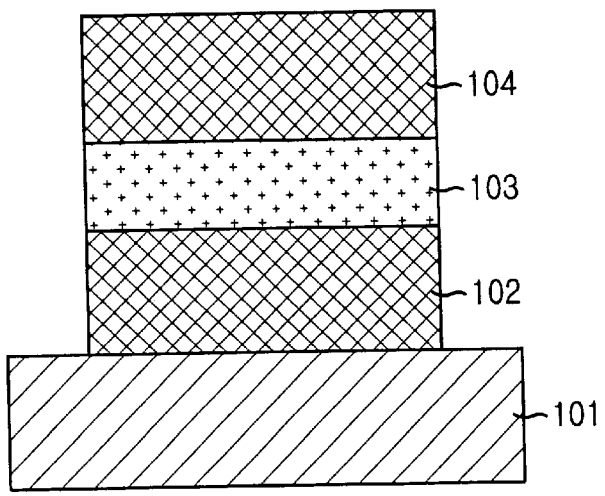
FIG.1 is a cross-sectional view for showing a conventional optical pumping organic micro-cavity laser.
Figure 2:
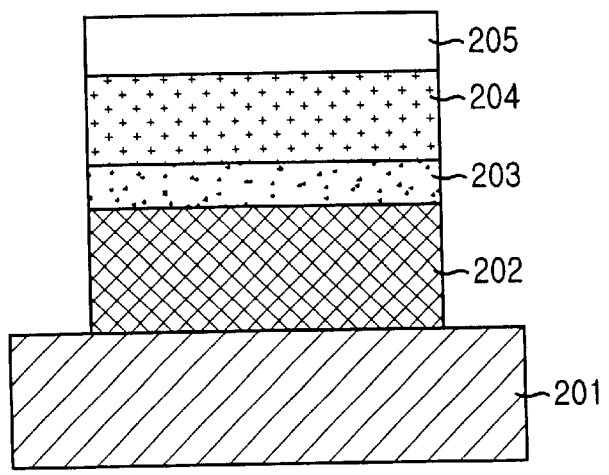
FIG. 2 is a cross-sectional view for showing a conventional electrical pumping organic micro-cavity laser.
Figure 3A:
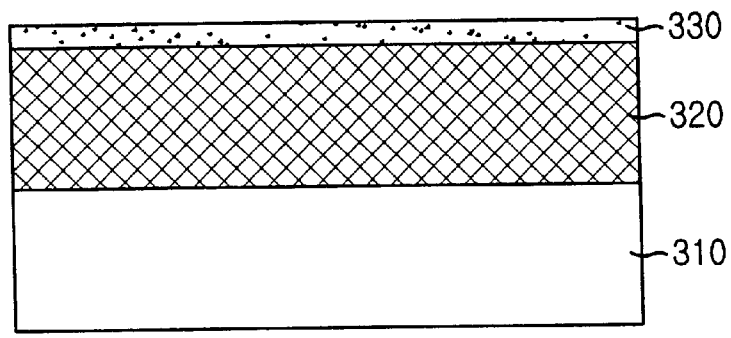
FIG. 3A to FIG. 3D are cross-sectional views for illustrating a manufacturing process for an organic micro-cavity laser according to the present invention.
Figure 3B:
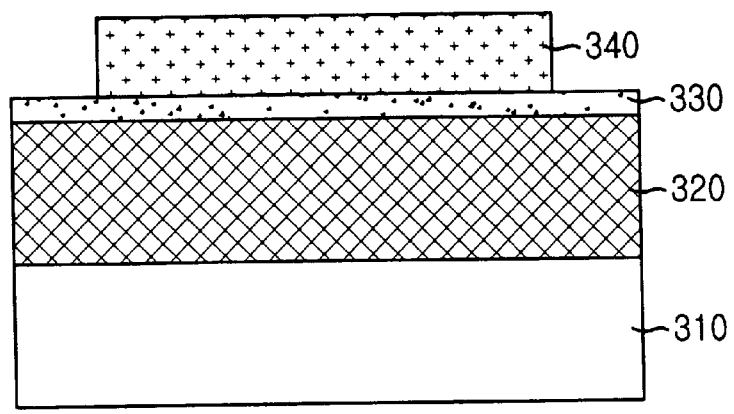
Figure 3C:
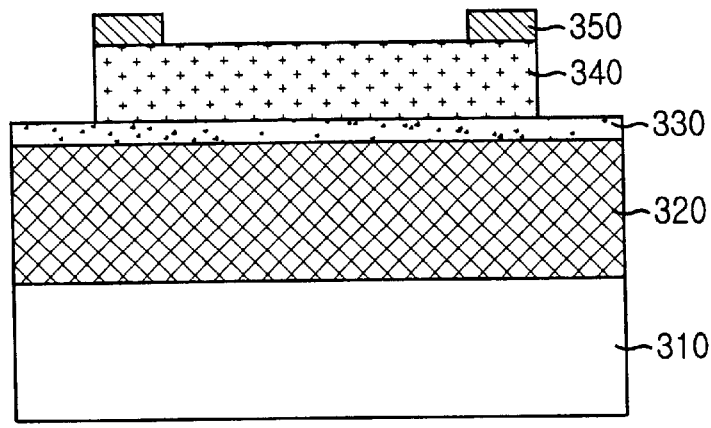
Figure 3D:
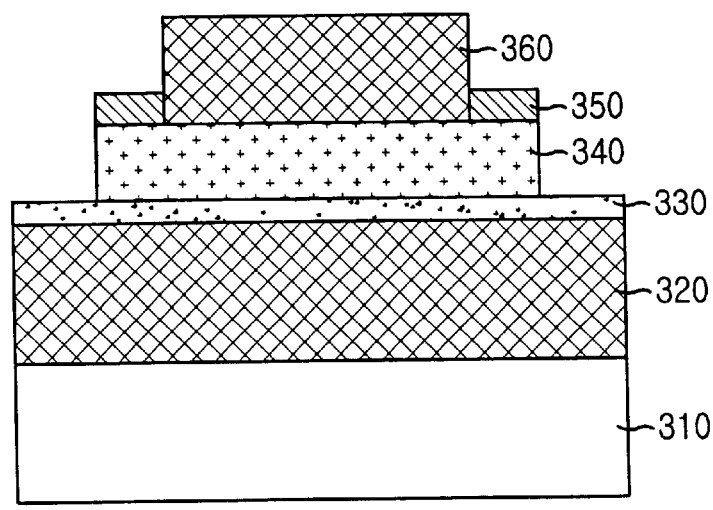

Referring to FIG. 3D, the organic micro-cavity laser comprises a substrate 310, a bottom mirror layer 320, a transparent bottom electrode 330, an active layer 340, a top electrode 350 and a top mirror layer 360.

The bottom mirror layer 320 is formed on the substrate 310 and the transparent bottom electrode 330 is formed on the bottom mirror layer 320. The active layer 340 is formed on the transparent bottom electrode 330. The top electrode 350 having a ring shape is formed on a peripheral portion of the active layer 340 and the top mirror layer 360 is formed on a portion of the active layer 340 except the peripheral portion of the active layer 340.

The bottom mirror layer 320 is a thin film composed of organic materials such as SiOx/TiOx or SiOx/MgOx. The bottom mirror 320 has a multi layers structure having distributed Bragg reflectors (DBR) each of which has a thickness of about $\lambda/4n$. The $\lambda$ means a wavelength and the n is a refractive index.

The bottom electrode 330 is made of a transparent material such as an indium tin oxide (ITO). In the meantime, the uppermost layer of the bottom mirror layer 320 and the bottom electrode 330 are combined to have thickness of about $\lambda/4n$.

The active layer 340 is composed of a luminous organic material which consists of single molecular substance or a high molecular substance. The active layer 340 is formed by a vacuum evaporation method when the active layer 340 is made of a single molecular luminous organic material. Also, the active layer 340 is formed by a spin coating method, a screen printing method or an ink-jet printing method when the active layer 340 is made of a polymeric luminous organic material.

Figure 4A:
FIG. 4A to FIG. 4H are diagrams for illustrating structures of various active layers and energy bands according to the present invention.
Figure 4B:
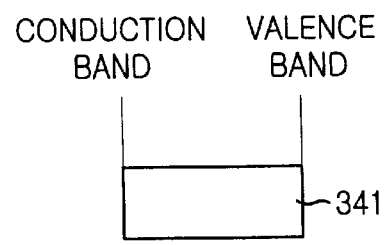
Figure 4C:
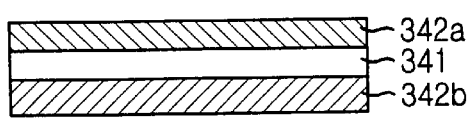
Figure 4D:
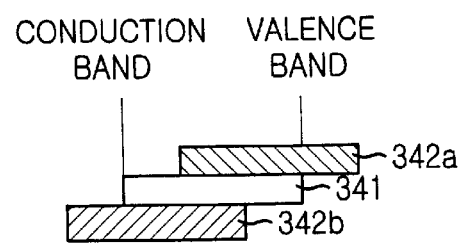

Meanwhile, the active layer 340 is composed of a single luminous layer 341 as shown in FIGS. 4A and 4B. Also, as shown in FIGS. 4C and 4D, the active layer 340 comprises a luminescent layer 341, a hole transport layer 342b and an electron transport layer 342a. The electron transport layer 342a is formed on the luminous layer 341 and the hole transport layer 342b is formed beneath the luminescent layer 341.

Figure 4E:
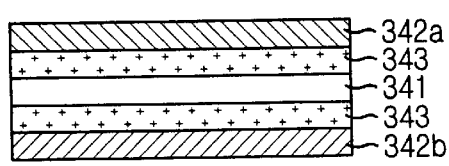
Figure 4F:
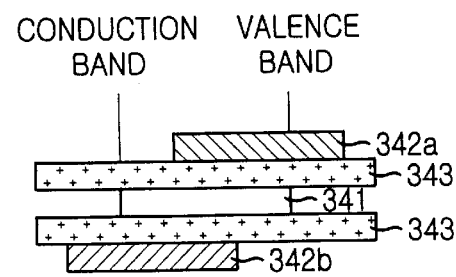

Furthermore, the active layer 340 comprises a first barrier layer 343a formed between the hole transport layer 342b and the luminescent layer 341 and a second barrier layer 343b formed between the luminescent layer 341 and the electron transport layer 342a as shown in FIGS. 4E and 4F. The barrier layers 343a, 343b and the luminescent layer 341 together from a well structure to enhance the confines of the carriers and the photons. Thus, the first and the second barrier layers 343a, 343b are composed of organic materials having band gaps larger than that of the luminous layer 341.

Figure 4G:
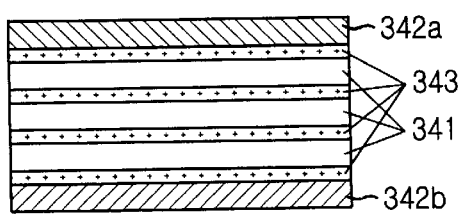
Figure 4H:
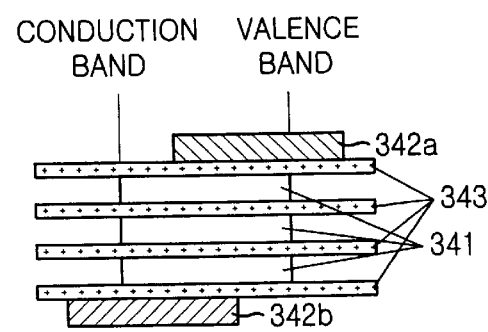

Referring to FIGS. 4G and 4H, the active layer 340 further comprises a plurality of barrier layers 343 and a plurality of luminescent layers 341. The barrier layers 343 and the luminescent layers 341 are alternatively formed on the hole transport layer 342b. That is, each luminescent layer 341 is formed between the barrier layers 343. The electron transport layer 342a is formed on the uppermost barrier layer. Hence, the active layer 340 has a structure of multiple wells in which a plurality of wells are repeatedly piled up in order to maximize the confinement and the carriers and the photons.

The top electrode 350 is a cathode where the electrons can be injected and is composed of one element selected from the group consisting of aluminum (Al), calcium (Ca), lithium (Li) and magnesium (Mg). The top electrode 350 is also composed of an alloy of those elements.

The top mirror layer 360 is composed of an organic material such as SiOx/TiOx or SiOx/MgOx. The top mirror layer 360 has a structure of multi layers composed of distributed Bragg reflectors each of which has a thickness of about $\lambda/4n$.

As for the organic micro-cavity laser diode having the above-described configuration, the holes and the electrons are injected into the active layer through the top and the bottom electrodes, and then the laser light emitted to the surface of the substrate through the central portion of the ring at the threshold current where the gain in the active layer equals to the loss of a cavity.

As it is described above, the organic micro-cavity laser of the present invention can greatly reduce the optical loss since the laser has the bottom mirror layer, the active layer and the top mirror layer. Also, the injection of current can be sufficiently accomplished because the top electrode having the ring shape is formed at the peripheral portion of the active layer so as to inject the current to the active layer. Furthermore, the organic micro-cavity laser of the present invention can minimize the optical loss and derive the lasing characteristic by the electrical pumping.

While the present invention has been particularly shown and described with reference to particular embodiments thereof, it will be understood by those skilled in the art that various changes in form and detail may be effected therein without departing from the spirit and scope of the invention as defined by the appended claims.

What is claimed is:

1. An organic micro-cavity laser comprising:
    a bottom mirror layer formed on a substrate;
    a bottom electrode formed on said bottom mirror layer;
    an active layer formed on said bottom electrode;
    a top electrode formed on a peripheral portion of said active layer; and
    a top mirror layer formed on said active layer except the peripheral portion of said active layer.

2. The organic micro-cavity laser as claimed in claim 1, wherein said bottom and said top mirror layers respectively include distributed Bragg reflectors, wherein each of said bottom and said top mirror layers has a thickness of $\lambda/4n$, wherein $\lambda$ means a wavelength and n represents a refractive index and wherein said bottom and said top mirror layers are made of an organic material selected from a group consisting of SiOx/TiOx and SiOx/MgOx.

3. The organic micro-cavity laser as claimed in claim 2, wherein an uppermost layers of said bottom mirror layer and said bottom electrode have thickness of $\lambda/4n$ respectively, wherein $\lambda$ means a wavelength and n represents a refractive index.

4. The organic micro-cavity as claimed in claim 2, sum of a thickness of an uppermost layer of said bottom mirror layer and a thickness of said bottom electrode together is $\lambda/4n$, wherein $\lambda$ means a wavelength and n represents a refractive index.

5. The organic micro-cavity laser as claimed in claim 1, wherein said bottom electrode is made of a transparent material such as an indium tin oxide.

6. The organic micro-cavity laser as claimed in claim 1, wherein said active layer is made of an organic material consisting of a single molecule or a polymer.

7. The organic micro-cavity laser as claimed in claim 1, wherein said active layer is a single luminescent layer.

8. The organic micro-cavity laser as claimed in claim 1, wherein said active layer includes a hole transport layer, a luminescent layer formed on the hole transport layer and an electron transport layer formed on the luminescent layer.

9. The organic micro-cavity laser as claimed in claim 1, wherein said active layer includes a hole transport layer, a first barrier layer formed on the hole transport layer, a luminescent layer formed on the first barrier layer, a second barrier layer formed on the luminescent layer and an electron transport layer formed on the second barrier layer.

10. The organic micro-cavity laser as claimed in claim 1, wherein said active layer includes a hole transport layer, a plurality of barrier layers formed on the hole transport layer, a plurality of luminescent layers respectively formed between the barrier layers and an electron transport layer formed on an uppermost layer of the barrier layers.

11. The organic micro-cavity laser as claimed in claim 1, wherein said top electrode is made of one metal selected from a group consisting of aluminum, calcium, lithium, magnesium and an alloy of those metals.

12. The organic micro-cavity laser as claimed in claim 1, wherein said top electrode has a ring shape.

* * * * *